(12) United States Patent
Sakurai

(10) Patent No.: US 7,528,854 B2
(45) Date of Patent: May 5, 2009

(54) DEVICE INCLUDING LIGHT-EMITTING ELEMENTS ABOVE A GLASS SUBSTRATE

(75) Inventor: Kazunori Sakurai, Chino (JP)

(73) Assignee: Seiko Epson Corporation, Tokyo (JP)

( * ) Notice: Subject to any disclaimer, the term of this patent is extended or adjusted under 35 U.S.C. 154(b) by 224 days.

(21) Appl. No.: 11/179,661

(22) Filed: Jul. 13, 2005

(65) Prior Publication Data

US 2006/0028535 A1 Feb. 9, 2006

(30) Foreign Application Priority Data

Aug. 3, 2004 (JP) ............... 2004-226371

(51) Int. Cl.
B41J 2/45 (2006.01)
B41J 2/385 (2006.01)
(52) U.S. Cl. ...................... 347/238; 347/130
(58) Field of Classification Search ............... 347/238, 347/244, 241, 130, 256
See application file for complete search history.

(56) References Cited

U.S. PATENT DOCUMENTS

| | | | |
|---|---|---|---|
| 6,121,994 A | 9/2000 | Kuribayashi et al. | |
| 6,476,551 B1 * | 11/2002 | Osawa et al. | 313/506 |
| 6,538,682 B2 * | 3/2003 | Ohkubo | 347/241 |
| 6,577,332 B2 * | 6/2003 | Osawa et al. | 347/241 |
| 6,656,609 B2 * | 12/2003 | Takahashi et al. | 428/690 |
| 6,825,867 B2 | 11/2004 | Koga et al. | |
| 7,081,912 B2 * | 7/2006 | Seki et al. | 347/244 |
| 7,119,826 B2 | 10/2006 | Nojima et al. | |
| 2003/0218422 A1 * | 11/2003 | Park et al. | 313/512 |
| 2003/0222575 A1 | 12/2003 | Yamazaki et al. | |
| 2004/0233271 A1 * | 11/2004 | Nojima et al. | 347/238 |

FOREIGN PATENT DOCUMENTS

| | | | |
|---|---|---|---|
| JP | 06099612 A * | 4/1994 | |
| JP | A-8-213649 | 8/1996 | |
| JP | 10035004 A * | 2/1998 | |
| JP | A-10-156823 | 6/1998 | |
| JP | A 11-198433 | 7/1999 | |
| JP | A-2000-9968 | 1/2000 | |
| JP | A 2000-77188 | 3/2000 | |
| JP | A-2000-246955 | 9/2000 | |
| JP | A-2002-124374 | 4/2002 | |
| JP | 2002270901 A * | 9/2002 | |
| JP | A-2003-19826 | 1/2003 | |
| JP | A-2003-217824 | 7/2003 | |
| JP | A-2003-323975 | 11/2003 | |
| JP | A-2003-332073 | 11/2003 | |
| JP | A-2004-58448 | 2/2004 | |
| JP | A-2004-195677 | 7/2004 | |
| JP | 2004311467 A * | 11/2004 | |

* cited by examiner

*Primary Examiner*—Hai C Pham
(74) *Attorney, Agent, or Firm*—Oliff & Berridge, PLC

(57) ABSTRACT

A line head includes an element substrate having light-emitting elements arrayed thereon and a sealing substrate that seals the light-emitting elements on the element substrate. A recess is formed on a portion of the substrate where light emitted from the light-emitting elements exits, and the recess is formed to include an entire region immediately above at least the light-emitting elements.

20 Claims, 12 Drawing Sheets

DEVICE INCLUDING LIGHT-EMITTING ELEMENTS ABOVE A GLASS SUBSTRATE

BACKGROUND

The present invention relates to a line head and an image forming apparatus including the same.

Among image forming apparatuses of the related art, image forming apparatuses in which a laser light source is used as an exposure unit are known.

Among this type of image forming apparatuses, for example, an image forming apparatus (for example, see Japanese Unexamined Patent Application Publication No. 11-198433) in which a line head including electroluminescent elements (hereinafter, referred to as EL elements) as light-emitting elements are used as a light source instead of the laser light source as the exposure unit is known.

Among the line heads, for example, in a line head in which the EL element is of a bottom-emission-type, light emitted from the light-emitting elements is transmitted through a glass layer (an element substrate) where the light-emitting elements are formed, and enters air. However, the traveling direction of the light may be changed or diffused and attenuated in the glass layer due to the total internal reflection caused by a difference in refractive index between the glass layer and air. As a result, the quantity of light which can be transmitted outside from the glass layer may be decreased.

Among the line heads, a technique is also known, in which a micro-lens (or lens) is provided in the substrate which is provided on the light-emitting elements and from which light exits, to efficiently output the emitted light to the outside (for example, see Japanese Unexamined Patent Application Publication No. 2000-77188).

It has therefore been considered to combine the line head composed of the EL elements with the technique which provides the line head with the lenses to provide lenses on the glass layer of the line head, thereby efficiently outputting the light that may be diffused.

However, as described above, for example, even when the line head composed of the EL elements is provided with the lenses, the glass layer (element substrate) is formed with a substantially large thickness in the manufacturing process. Therefore, the light emitted from the light-emitting elements may be absorbed and attenuated while it passes through the glass layer irrespective of the presence of the lenses, which may cause a decrease in efficiency of the light to be output from the glass layer.

Accordingly, it is difficult to efficiently output the light emitted from the light-emitting elements out of the glass layer. This deteriorates the exposure efficiency of the line head.

Also, the provision of the lens portion causes the light emitted from a light-emitting element to enter the lens formed immediately above the adjacent light-emitting layer, thereby generating crosstalk, which deteriorates the exposure efficiency of the line head.

In addition, even in the top-emission-type line head, the same problem occurs in that the sealing substrate is required to be sufficiently thick, similarly to the element substrate.

SUMMARY

An advantage of the invention is that it provides a line head that can efficiently output light when the light emitted from light-emitting elements is output and that can prevent any crosstalk, thereby improving the exposure efficiency, and an image forming apparatus including such as a line head.

According to a first aspect of the invention, a line head includes an element substrate having light-emitting elements arrayed thereon; and a sealing substrate that seals the light-emitting elements on the element substrate. A recess is formed on a portion of the substrate where light emitted from the light-emitting elements exits, and the recess is formed to include an entire region immediately above at least the light-emitting elements.

According to the line head, since the recess is formed on the substrate where light exits and the thickness of the substrate in a region through which light is transmitted is small, the distance that the light emitted from the light-emitting elements is transmitted through the substrate becomes short. Accordingly, the attenuation of light, such as light is absorbed into the substrate when the light is transmitted through the substrate, is relieved. As a result, the light emitted from the light-emitting elements can be efficiently transmitted outside of the substrate, thereby improving the exposure efficiency of the line head.

Further, since the substrate becomes thin in a region through which light is transmitted, the light emitted from a light-emitting element can be prevented from entering a region through which the light from the adjacent light-emitting element is transmitted, to prevent occurrence of any crosstalk, which makes it possible to improve the exposure efficiency of the line head.

Further, it is preferable that a bottom surface of the recess be a rough surface.

According to the configuration, the light emitted from the light-emitting elements is scattered by the bottom surface of the recess. As a result, as for the light entered at an angle equal to or greater than a total reflection angle, a portion of the light is output from the substrate. Therefore, the light emitted from the light-emitting elements can be efficiently output from the substrate. Thus, the exposure efficiency of the line head can be improved.

Further, when the working that forms the recess is performed, the bottom surface of the recess is normally a rough surface. Thus, the treatment after the working can be omitted, and accordingly the productivity of the line head can be enhanced.

Further, it is preferable that a corner of the bottom of the recess be formed in a curved shape which is concaved toward the inside of the recess.

According to the configuration, when a recess is formed or after a recess is formed, a stress concentration on the corner of the recess can be relieved, thereby preventing the occurrence of cracks.

Further, it is preferable that a lateral wall surface of the recess be formed in a tapered shape that becomes gradually closer to the inside as the lateral wall surface approaches the bottom side.

According to the configuration, when a recess is formed or after a recess is formed, a stress concentration on the corner of the recess can be relieved, thereby preventing the occurrence of cracks.

Further, it is preferable that the recess is formed so as to pass through a region between two opposite short sides of the substrate where the recess is formed.

According to the configuration, the workability when the recess is formed becomes easy, and accordingly the productivity of the line head can be improved.

Further, it is preferable that the recess is formed in a closed shape on the substrate where the recess is formed, without being opened to the side of the substrate.

According to the configuration, since a thick portion of the outer peripheral portion is left in the substrate, a decrease in strength of the substrate itself caused by the provision of the recess can be suppressed.

Further, it is preferable that the recess be formed to correspond to an array of the light-emitting elements.

According to the configuration, the area of the recess formed on the substrate can be further decreased, and thus a decrease in strength of the substrate itself caused by the provision of the recess can be reduced.

Further, it is preferable that the recess be formed to correspond to each of the light-emitting elements.

According to the configuration, since the area of the recess formed on the substrate can be suppressed to a required minimum amount, a decrease in strength caused by the provision of the recess can be further decreased.

In a case where, for example, a ball-like lens is disposed on each of the light-emitting elements, the ball-like lens is allowed to drop into the recess, so that the alignment of the ball-like lens with the recess can be easily performed.

Further, it is preferable that the bottom of the recess be provided with a spherical lens.

According to the configuration, the condensing degree of the light emitted from the light-emitting elements increases, and thus light is output through the spherical lens even when the light enters an interface between the substrate and the lens at an angle equal to or larger than a total reflection angle.

That is, since the light which has entered the interface between the substrate and the lens is refracted and thereby condensed and output as the light approximately vertical to the substrate, the focusability of the light increases, thereby improving the exposure efficiency of the line head.

Further, it is preferable that the bottom of the recess be provided with a ball-like lens.

In this way, the bottom of the recess is provided with a ball-like lens having a smaller aperture than that of the spherical lens, so that a higher refractive index can be obtained. Accordingly, the condensing degree of the light emitted from the light-emitting elements can be further increased.

Thus, for example, in a case where an image of light is focused on a place away from the light-emitting elements, the light can be focused on a desired position without using a group of imaging lenses.

Further, it is preferable that the ball-like lens be fixed to the bottom of the recess with an adhesive.

According to the configuration, the ball-like lens can be firmly fixed to the bottom of the recess. Further, light can be led into the lens through the adhesive because any gap between the light-emitting elements and the spherical lens can be removed.

Further, preferably, in a case where a plurality of rows of the light-emitting elements are formed, and a plurality of the ball-like lens corresponding to the plurality of rows of light-emitting elements are arrayed in the recess, the adhesive is coated on each of the rows of ball-like lenses.

Thus, since the light from the light-emitting elements is refracted or totally reflected at the interface between the adhesive and air, light is prevented from entering the adjacent row of an adhesive through the adhesive, and thus the light is kept from entering the adjacent row of lenses through the adhesive. Thus, any crosstalk in the row direction of the lenses can be prevented.

Further, it is preferable that the adhesive be coated on each of the ball-like lenses.

According to the configuration, since the adhesive is coated on each of the ball-like lens, the light emitted from the respective light-emitting elements does not enter any adjacent lenses in the column direction or the row direction, so that any crosstalk of other lenses can be prevented.

Further, preferably, in a case where the light-emitting elements are formed on the element substrate, a second recess is formed on the sealing substrate at a place other than the portion immediately above the light-emitting elements, and the second recess is provided with a drying agent.

According to the configuration, since the second recess is provided with a drying agent, a negative electrode can be prevented from deteriorating due to moisture or the like.

Further, since the second recess is formed on the sealing substrate at a place other than the portion immediately above the light-emitting elements, the sealing substrate has a substantial thickness at a portion immediately above the substrate where the recess is formed. Thus, a decrease in strength of a line head when a second recess is formed on a substrate can be relieved.

Furthermore, according to another aspect of the invention, an image forming apparatus includes the above-mentioned line head.

Since the image forming apparatus includes the lines head which can prevent any crosstalk of the light emitted from the light emitting elements to efficiently output light, the exposure efficiency of the line head as a light source and exposure precision can be improved in the image forming apparatus including the line head.

BRIEF DESCRIPTION OF THE DRAWINGS

The invention will be described with reference to the accompanying drawings, wherein like numbers reference like elements, and wherein.

DETAILED DESCRIPTION OF EMBODIMENTS

Hereinafter, the invention will be described in detail.

Figure 1A:
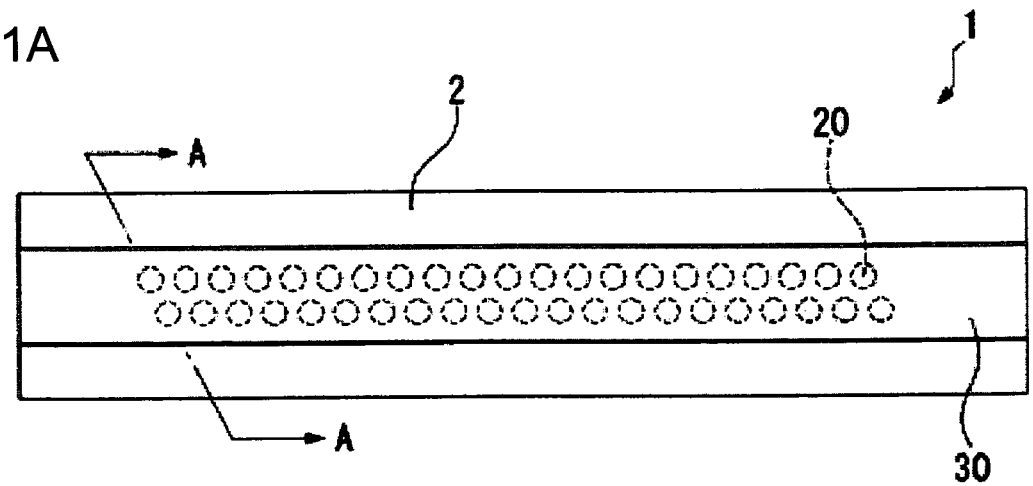
FIG. 1A illustrates a line head according to a first embodiment.

FIG. 1A illustrates a line head according to a first embodiment of the invention.

Figure 1B:
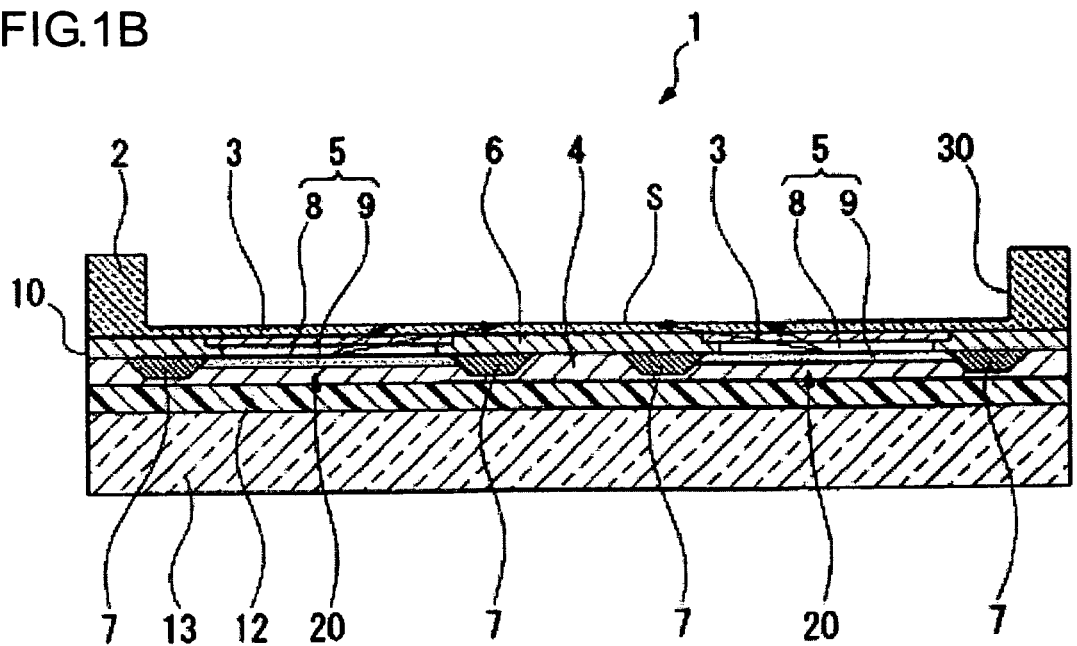
FIG. 1B is a side sectional view of the line head according to the first embodiment.

FIG. 1B is a sectional view taken along a line A-A in FIG. 1A.

As shown in FIGS. 1A and 1B, a line head 1 includes an element substrate 10 in which light-emitting elements 20 composed of electroluminescent elements (hereinafter, referred to as EL elements) are arrayed in two rows in a staggered arrangement, and a sealing substrate 13 that seals the element substrate 10.

The element substrate 10 has a rectangular glass substrate 2 in which driving elements (not shown) composed of TFT elements are formed, transparent electrodes (positive electrodes) 3 formed on the glass substrate 2, and a negative electrode 4.

Further, functional layers 5 are formed between the transparent electrodes 3 and the negative electrode 4, and the transparent electrodes 3, the negative electrode 4 and the functional layers 5 constitute the light-emitting elements 20.

The transparent electrodes 3 are patterned and formed on each single dot region formed on the glass substrate 2, and are connected to the driving elements composed of TFT elements, various wiring lines, and the like. In the present embodiment, the transparent electrodes are formed of indium tin oxide (ITO).

An inorganic partition wall 6 made of $SiO_2$ is formed on the glass substrate 2 so as to surround the transparent electrodes 3, and organic partition walls 7 made of resin are formed on the inorganic partition wall 6.

As a material used for the organic partition wall 7, polyimide resin, acrylic resin, etc., may be used. Alternatively, a material having a structure in which a fluorine element is contained in those materials in advance may be used.

Thereby, one functional layer 5 composed of a hole injection layer 8 and a light-emitting layer 9 is laminated in a recess (not shown) on the transparent electrode 3. As a material for forming the light-emitting layer 9, a known light-emitting material that can emit fluorescence or phosphorescence may be used.

The negative electrode 4 is formed so as to cover all the pixel regions. For example, the negative electrode is formed such that a Ca layer and an Al layer are laminated in this order from the light-emitting layer 9.

The sealing substrate 13 made of glass or the like is joined to the negative electrode 4 of the element substrate 10 with an adhesive resin 12, whereby the element substrate 10 is sealed by the sealing substrate 13.

The line head 1 according to the present embodiment is a bottom-emission-type line head in which the light emitted by the light-emitting elements 20 exits from the element substrate 10.

A groove 30 that becomes the recess of the invention is formed on the external surface of the glass substrate 2. The groove 30 is formed so as to pass through a region between opposite short sides of the glass substrate 2.

Here, the groove 30 is formed immediately above the light-emitting elements 20, and is disposed such that all the arrayed light-emitting elements 20 are included within a location where the groove is formed.

Thus, the thickness of the glass substrate 2 immediately above the light-emitting elements 20 where the groove 30 is formed is smaller than a place where the groove 30 is not formed.

Accordingly, in the groove 30, the distance that the light emitted by the light-emitting elements 20 travels in the glass substrate 2 until it exits out of the glass substrate 2 is short.

The groove 30 is formed by, for example, a method such as polishing, sand blasting, dry etching, or wet etching.

In a case where a post-treatment process, such as a polishing process, is not performed on a bottom surface of the groove 30 on account of simplification or the like of the manufacturing process after the groove 30 has been formed, the bottom surface of the groove 30 becomes a rough surface S. Thus, the bottom surface of the groove 30 takes a shape having unevenness microscopically.

The groove 30 is formed on the glass substrate 2 after the element substrate 10 is sealed by the sealing substrate 13 to form the line head 1. Thus, since the groove 30 is formed in a state in which the line head 1 has a substantial thickness due to the sealing substrate 13, the sealing substrate 13 serves as a reinforcing member, thereby preventing the glass substrate 2 from being cracked.

Next, a case in which the light emitted by each of the light-emitting elements 20 is emitted to the glass substrate 2 in the line head 1 of the present embodiment will be described.

Since the line head 1 is of a bottom-emission-type, as described above, the light from the light-emitting element 20 is emitted to the glass substrate 2.

Then, since the bottom surface of the groove 30 is the rough surface S, the light emitted by the light-emitting element 20 enters an uneven portion of the rough surface S at various angles. Thus, even if the light emitted from the light-emitting element 20 enters the bottom of the groove 30 at an angle equal to or greater than a total reflection angle, the light reaches the uneven portion of the groove 30, whereby the incidence angle of a portion of the light becomes less than the total reflection angle microscopically, and the light exits out of the glass substrate 2.

At this time, the light emitted from the light-emitting element 20 is absorbed in the glass substrate 2 such that the attenuating ratio of the light decreases, because the glass substrate 2 in a transmissive region through which the light is transmitted is thin, and the distance transmitted through the glass substrate 2 to a boundary with air is short.

Further, since the glass substrate 2 is thin as indicated by an arrow in FIG. 1B, the light reaches the interface between the rough surface S of the glass substrate 2 and air before the light enters the glass substrate 2 in a transmissive region of the adjacent light-emitting element 20 through which the light is transmitted.

Also, since there is no case where the light is refracted by the rough surface S and then transmitted outside or where the light is totally reflected by the rough surface S and then transmitted outside, the light does not enter a transmissive region of the adjacently formed light-emitting element 20.

According to the line head 1 of the present embodiment, since the glass substrate 2 in the region of the light-emitting element 20 through which light is transmitted is thin, the light is absorbed while being transmitted through the glass substrate 2 so that the attenuating ratio thereof can be decreased, and the light can be efficiently output from the glass substrate 2, which results in an improvement in the exposure efficiency of the line head 1.

As indicated by the arrow in FIG. 1B, since the light from the light-emitting element 20 does not enter the adjacent light-emitting region, occurrence of any crosstalk can be prevented, and the exposure precision of a line head can be improved.

Further, the rough surface S is adopted as the bottom surface of the groove 30 so that light can be transmitted outside at an angle equal to or great than the total reflection angle.

Thus, the light from the light-emitting element 20 can be efficiently output from the glass substrate 2, and the exposure efficiency of the line head 1 can be improved.

Further, since the groove 30 is formed to pass through a region between the short sides of the glass substrate 2 so that cutting can be performed so as to pass through a region between the short sides at one time when the groove 30 is processed, the workability is improved, and the productivity of the line head 1 can be enhanced.

Figure 2:
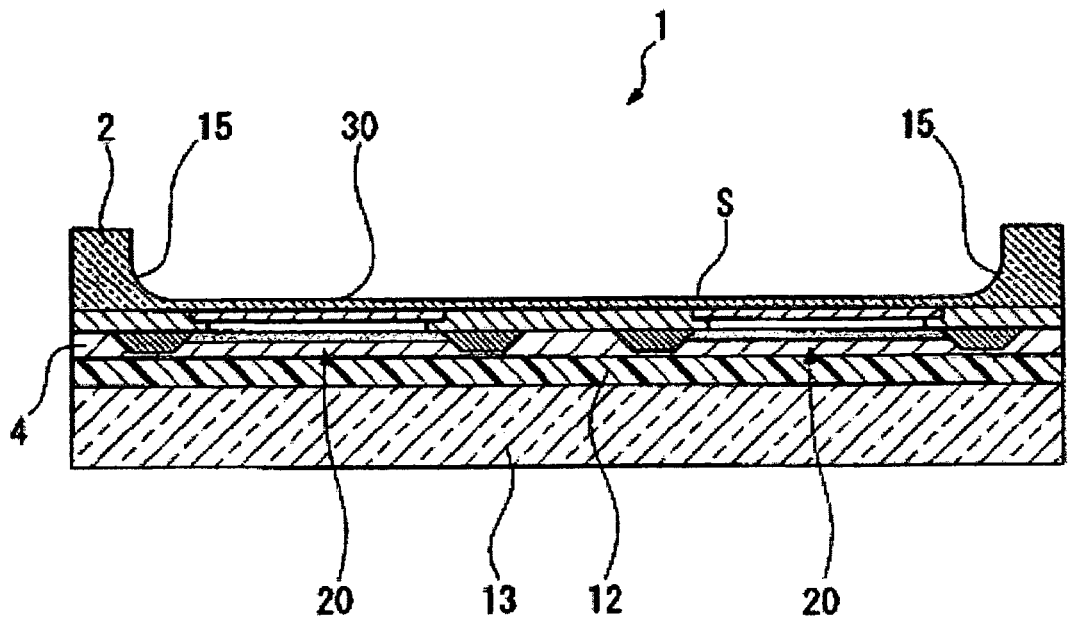
FIG. 2 is a side sectional view of the line head in which a corner of the bottom of a recess is formed in a curved shape.

In addition, although the present embodiment is described with respect to a case in which the bottom surface and the side wall surfaces of the groove 30 form a right angle, as shown in FIG. 2, a corner at the bottom of the groove 30 may be formed as a curved portion 15 which is concaved toward the inside of the groove 30, so that external force to be applied to the corner at the bottom of the groove 30 can be relieved.

In this way, any stress concentration on the corner of the groove 30 can be relieved, thereby preventing the occurrence of cracks in the corner.

Figure 3:
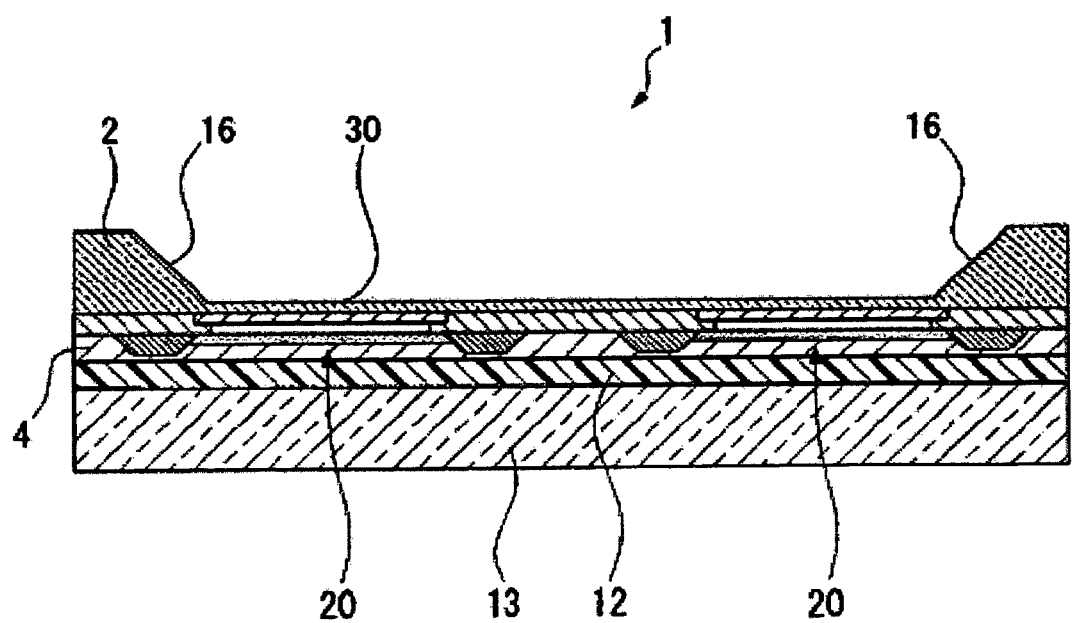
FIG. 3 is a side sectional view of the line head in which a corner of the bottom of the recess is formed in an inclined tapered shape.

As shown in FIG. 3, external force to be applied to the corner may be relieved by an inclined tapered portion 16 which becomes gradually closer to the inside as the inner wall surface of the groove 30 approaches the bottom of the groove.

In this way, any stress concentration on the corner of the groove 30 can be relieved, thereby preventing the occurrence of cracks in the corner.

Next, a line head 1 according to a second embodiment of the invention will be described.

The line head 1 of the present embodiment has the same structure as the structure of the line head 1 in the first embodiment except for the shape of a recess formed on the glass substrate 2, which will be described later.

Figure 4A:
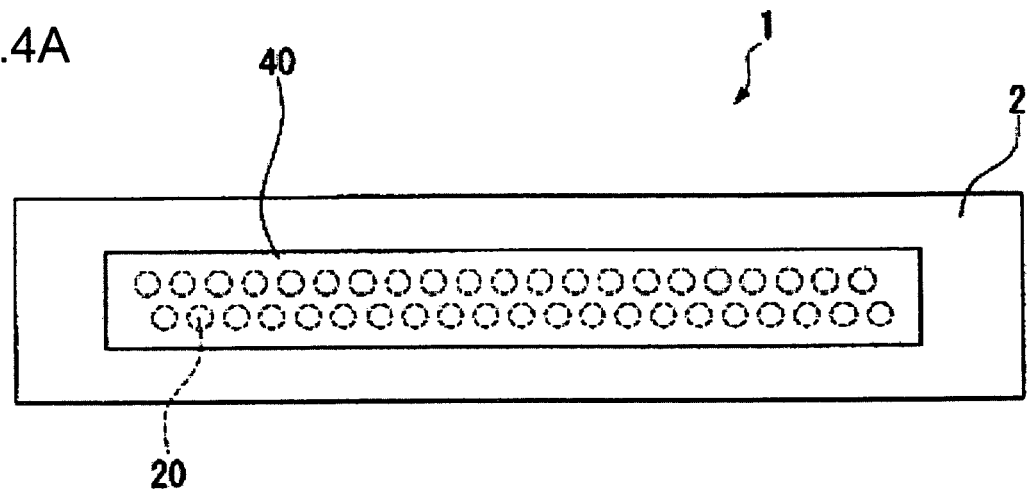
FIG. 4A illustrates a line head according to a second embodiment.

FIG. 4A is a plan view of the line head 1 according to the second embodiment. As shown in FIG. 4A, the glass substrate 2 is formed with the recess 40. The recess 40 is formed immediately above an array of light-emitting elements 20, and formed in a state that is closed with the glass substrate 2 so that it is not opened to the lateral surface of the glass substrate 2.

According to the line head 1 of the present embodiment, similar to the effects that can be obtained from the structure common to that of the first embodiment that the glass substrate 2 is formed with the recess, since the glass substrate 2 above a light-emitting region is formed thinly, the light emitted from a light-emitting element can be efficiently utilized to improve the exposure efficiency of the line head 1, and occurrence of any crosstalk can be prevented to improve the exposure precision of the line head 1.

Further, since the recess 40 is formed in a state that is closed with the glass substrate 2 to leave a thick portion of the glass substrate 2 at the outer periphery of the glass substrate 2 to make the outer periphery of the glass substrate thick, as compared to the groove 30 that passes through a region between the short sides as in the first embodiment, a decrease in strength of the line head 1 caused by forming the recess 40 in the glass substrate 2 can be suppressed.

Figure 4B:
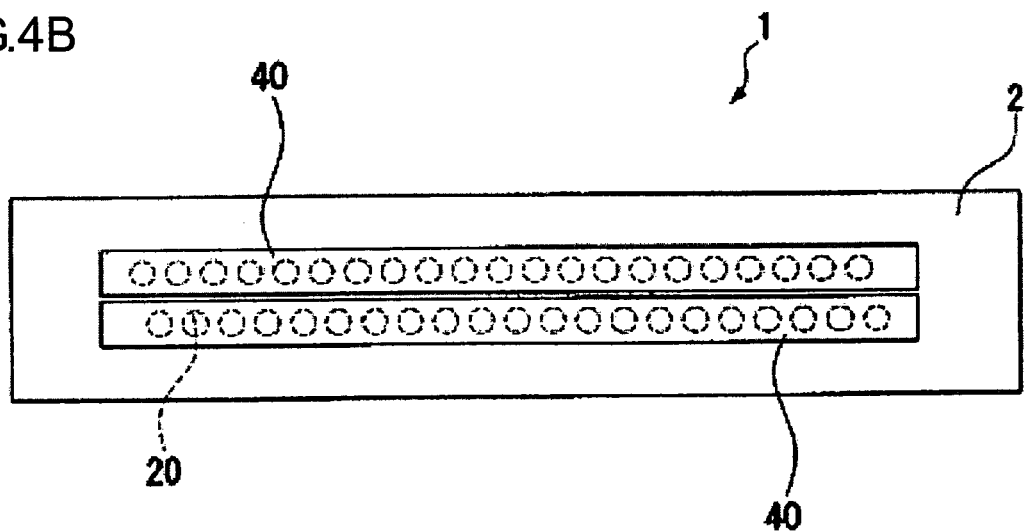
FIG. 4B illustrates another form of the line head according to the second embodiment.

As shown in FIG. 4B, the recess 40 is formed on each row of the light-emitting elements 20 which are arrayed in two rows in a staggered arrangement, so that a thin portion of the glass substrate 2 can be further reduced. As a result, a decrease in strength of the line head 1 can be suppressed.

In addition, the curved portion 15 as shown in FIG. 2 or the inclined tapered portion 16 as shown in FIG. 3 is adopted as the bottom surface of the recess 40, so that cracks can be prevented from occurring in the corner of the bottom surface in the recess 40.

Next, a line head 1 according to a third embodiment of the invention will be described.

The line head 1 of the present embodiment has the same structure as the structure of the line head 1 in the first embodiment except for a groove formed on the glass substrate 2, which will be described later.

Figure 5A:
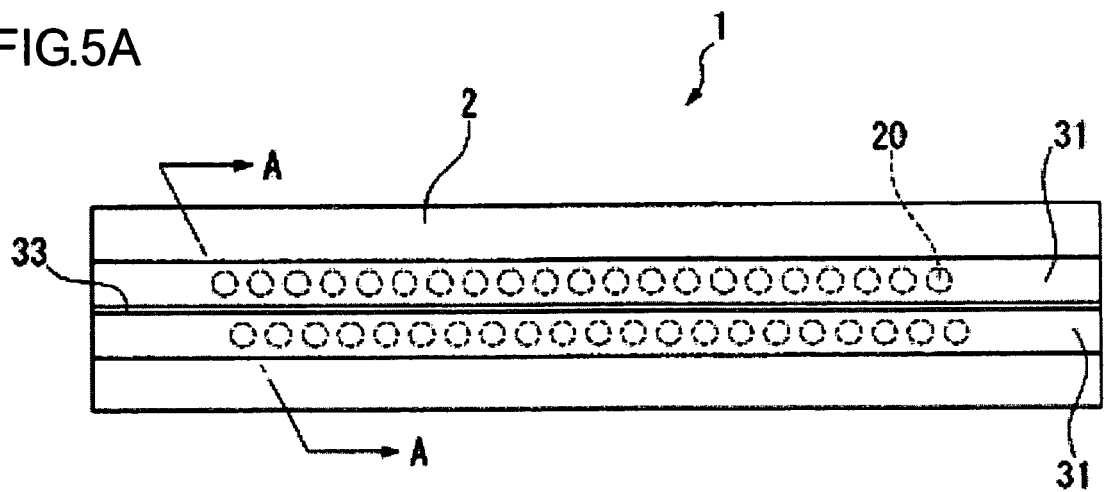
FIG. 5A illustrates a line head according to a third embodiment.
Figure 5B:
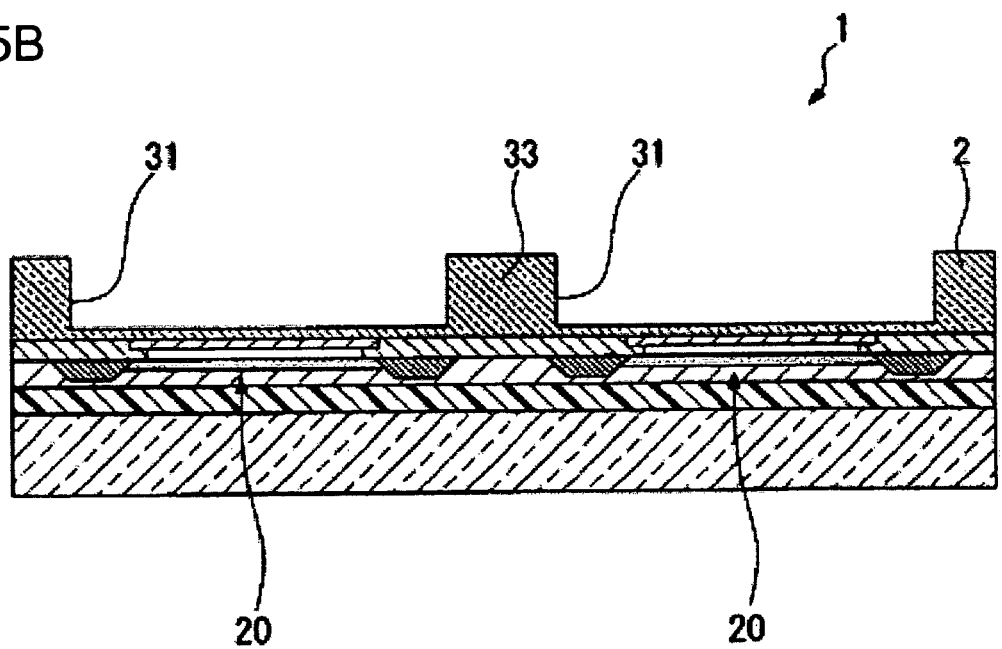
FIG. 5B is a side sectional view of the line head according to the third embodiment.

FIG. 5A illustrates the line head 1 according to the third embodiment, and FIG. 5B is a side sectional view taken along a line A-A in FIG. 5A.

As shown in FIGS. 5A and 5B, a groove (recess) 31 is formed on the glass substrate 2 so as to correspond to each row of the light-emitting elements 20 which are arrayed in two rows in a staggered arrangement. Alternatively, the groove 31 is formed in the shape of a groove so as to pass through a region between opposite short sides of the glass substrate 2.

Since the groove 31 is formed immediately above the array of the light-emitting elements 20 to leave a partitioning portion 33 between the arrays of the light-emitting elements 20, as compared to the groove 30 of the first embodiment, a thinly worked portion of the glass substrate 2 can be reduced.

According to the line head 1 of the present embodiment, in addition to the effects that can be obtained from the structure common to that of the first embodiment that the recess is formed on the glass substrate 2, the area of the groove 31 formed on the glass substrate 2 can be reduced, the strength of the glass substrate 2 can be maintained, and the whole strength of the line head 1 can be prevented from decreasing caused by forming the groove 31.

In addition, the curved portion 15 as shown in FIG. 2 is formed on the bottom of the groove 31, or the inclined tapered portion 16 is formed on the lateral wall surface of the groove 31, so that cracks can be prevented from occurring due to any stress concentration on the corner of the bottom of the groove 31.

Next, a line head 1 according to a fourth embodiment of the invention will be described.

Figure 6A:
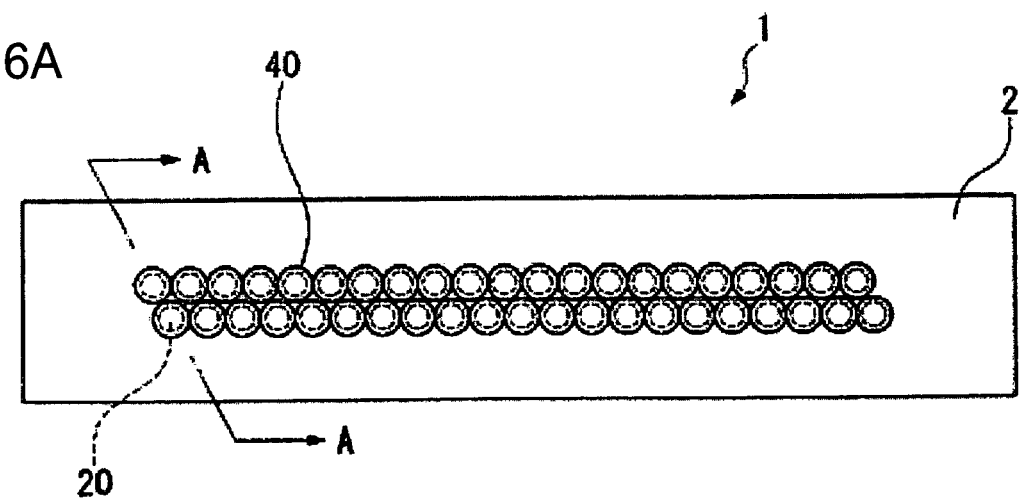
FIG. 6A illustrates a line head according to a fourth embodiment.
Figure 6B:
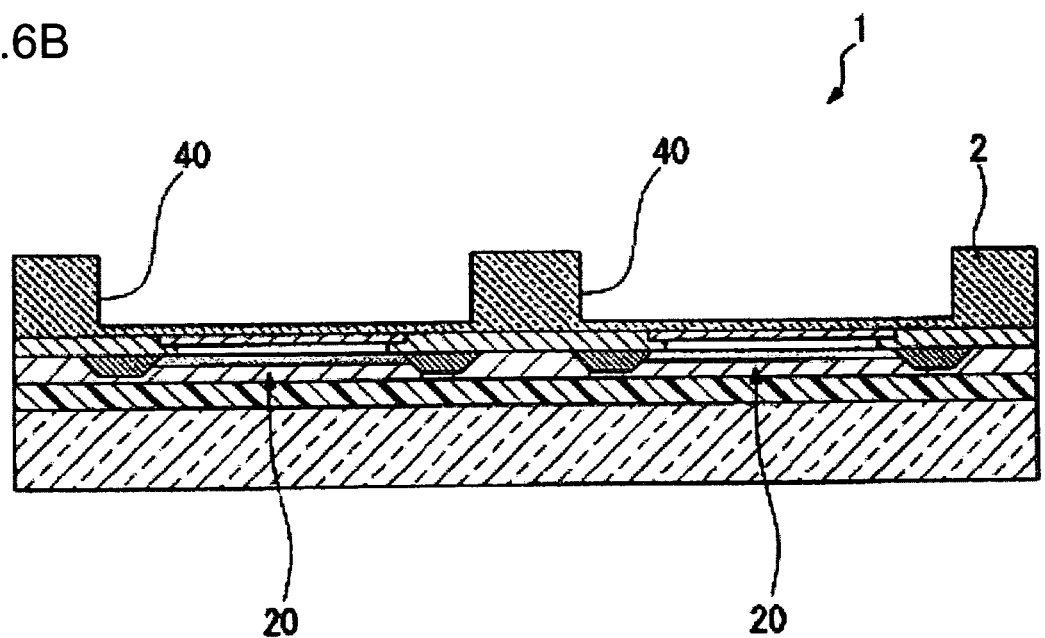
FIG. 6B is a side sectional view of the line head according to the fourth embodiment.

FIG. 6A is a plan view of the line head 1 according to the fourth embodiment, and FIG. 6B is a side sectional view taken along a line A-A in FIG. 6A.

The line head 1 of the present embodiment has the same structure as the structure of the first embodiment except for the shape of a groove formed on the glass substrate 2, which will be described later.

As shown in FIGS. 6A and 6B, a recess 40 is formed corresponding to each of the light-emitting elements 20. Further, the recess 40 is formed and disposed immediately above each of the light-emitting elements 20.

According to the line head 1 of the present embodiment, in addition to the effects that can be obtained from the structure common to that of the first embodiment that the recess is formed on the glass substrate 2, the formed region of the recess 40 can be minimized to a required amount, the strength of the glass substrate 2 can be held, and a decrease in strength of the line head 1 in a region where the recess 40 is formed can be suppressed.

In addition, a curved portion is formed on the bottom of the recess 40 is curved, or an inclined tapered portion is formed on the lateral wall surface of the recess 40, so that the occurrence of cracks in the corner of the bottom surface in the recess 40 can be prevented.

Next, a line head 1 according to a fifth embodiment of the invention will be described.

Figure 7A:
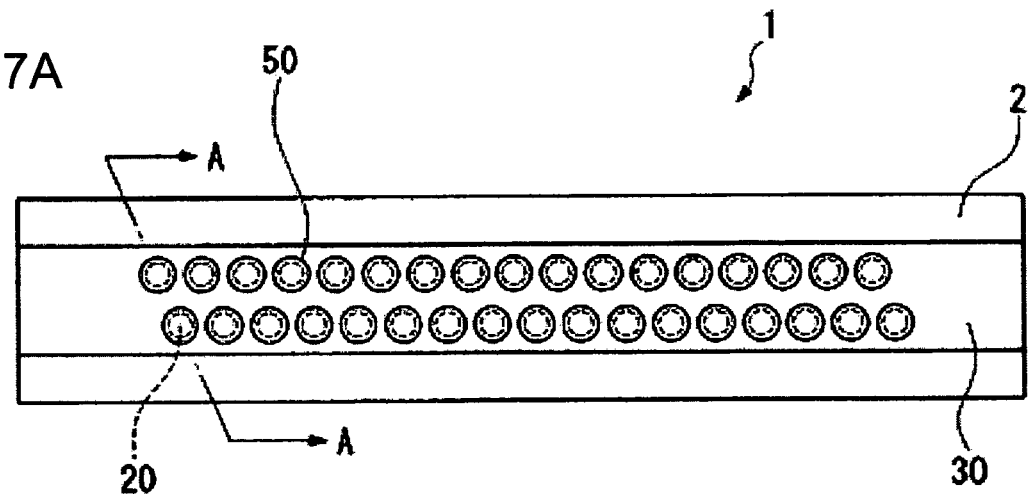
FIG. 7A illustrates a line head according to a fifth embodiment.

FIG. 7A is a plan view of the line head 1 according to the fifth embodiment of the invention.

Figure 7B:
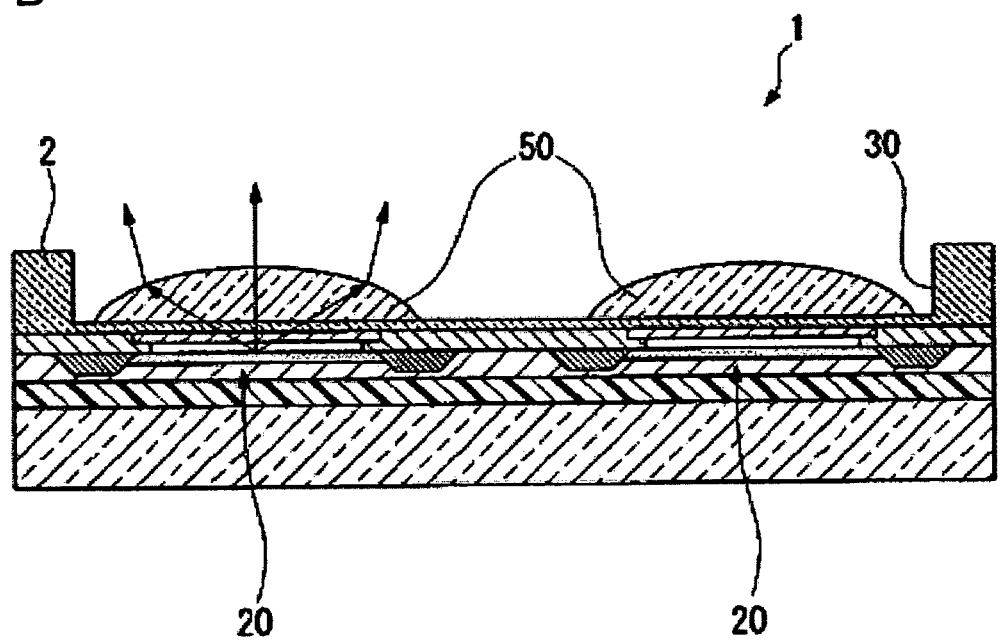
FIG. 7B is a side sectional view of the line head according to the fifth embodiment.

FIG. 7B is a side sectional view taken along a line A-A in FIG. 7A.

The line head 1 of the present embodiment has the same structure as the structure of the line head 1 in the first embodiment except that a lens to be described later is formed.

Arrows in FIG. 7B indicate the exit directions of the light emitted from the light-emitting element 20.

In the line head 1 according to the present embodiment, as shown in FIGS. 7A and 7B, spherical lenses 50 are formed on the glass substrate 2, and are disposed immediately above the respective light-emitting elements 20. Each lens 50 has the same refractive index as that of the glass substrate 2, and is adapted to focus the light emitted from the light-emitting element 20 like a convex lens.

As a method of forming the lens 50, for example, a method in which a mold for the lens 50 is first prepared, the mold for the lens 50 is then pressed against a resin to be cured by ultraviolet irradiation, and the resin is subjected to the ultraviolet irradiation to be cured, thereby forming the lens, or a method in which a material for the lens 50 is discharged onto the glass substrate 2 immediately above the light-emitting element 20 by a liquid droplet discharged method, and the material is then cured, thereby forming the lens can be used.

Next, a case in which light is emitted from the light-emitting element 20 in the line head 1 of the present embodiment will be described.

As described previously, the light emitted from the light-emitting element 20 is transmitted through the glass substrate 2 substantially without being attenuated in the glass substrate 2 because the glass substrate 2 in a light-transmitting region of the light-emitting element is thin.

Then, since the light is transmitted through the lens 50 having the same reflective index as the glass substrate 2, the light enters the lens 50 in the direction denoted by the arrows in FIG. 7B without any refraction or reflection (total reflection) at the interface between the glass substrate 2 and the lens 50.

Then, the light which has entered the lens 50 is refracted at an interface between the lens 50 and air to be focused in a direction vertical to the glass substrate 2 as denoted by the arrows in FIG. 7B.

According to the line head 1 of the present embodiment, in addition to the effects that can be obtained from the structure common to that of the first embodiment that the recess is formed on the glass substrate 2, since the glass substrate 2 above the light-transmitting region of the light-emitting element is thin, the light exited from the light-emitting element 20 can be efficiently utilized, and the occurrence of cracks can be prevented to improve the exposure efficiency and exposure precision of the lined head.

Further, since the lens 50 having the same refractive index as that of the glass substrate 2 is formed, the light from the light-emitting element 20 can be efficiently transmitted outside through the lens 50 without being refracted or totally reflected at the interface between the glass substrate 2 and the lens 50.

Further, since the light which has entered the glass substrate 2 at an angle equal to or greater than the total reflection angle is refracted, the light can be output as the light approximately vertical to the glass substrate 2, and the light focusability of the light emitted from the light-emitting element 20 can be increased, thereby enhancing the exposure efficiency of the line head.

In addition, instead of the groove 30 of the first embodiment, the lenses 50 may be formed after forming the groove 30 corresponding to each array of the light-emitting elements 20, as shown in FIG. 4A, forming the recess 40 in an entire region on the arrays of the light-emitting elements 20 in a closed state, or as shown in FIG. 4B, or forming the recess 40 in each array of the light-emitting elements 20 in a closed state.

Alternatively, as shown in FIGS. 6A and 6B, the lens 50 may be formed after forming the recess 40 immediately above each of the light-emitting elements 20.

Alternatively, a curved portion may be formed on the bottom of the recess 40 or an inclined tapered portion may be formed on the lateral wall surface of the recess 40, so that the occurrence of cracks in the corner of the bottom surface in the recess 40 can be prevented.

Next, a line head 1 according to a sixth embodiment of the invention will be described.

Figure 8A:
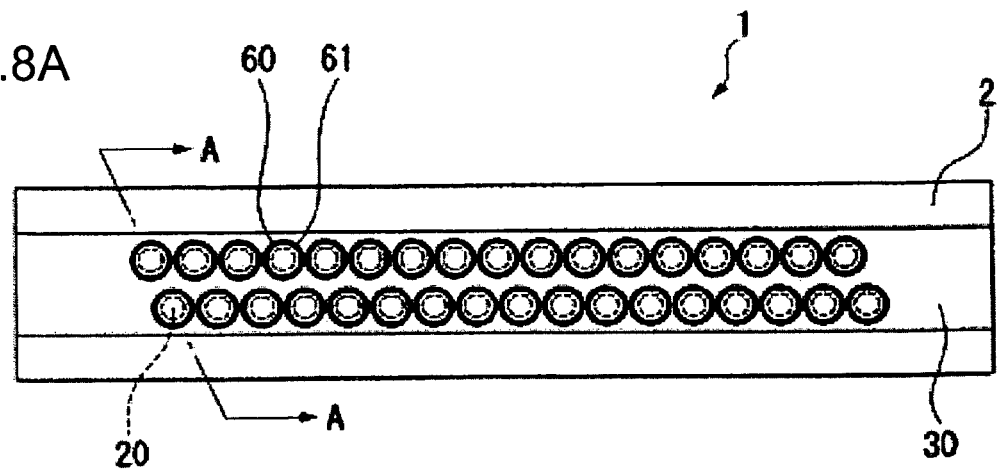
FIG. 8A illustrates a line head according to a sixth embodiment.
Figure 8B:
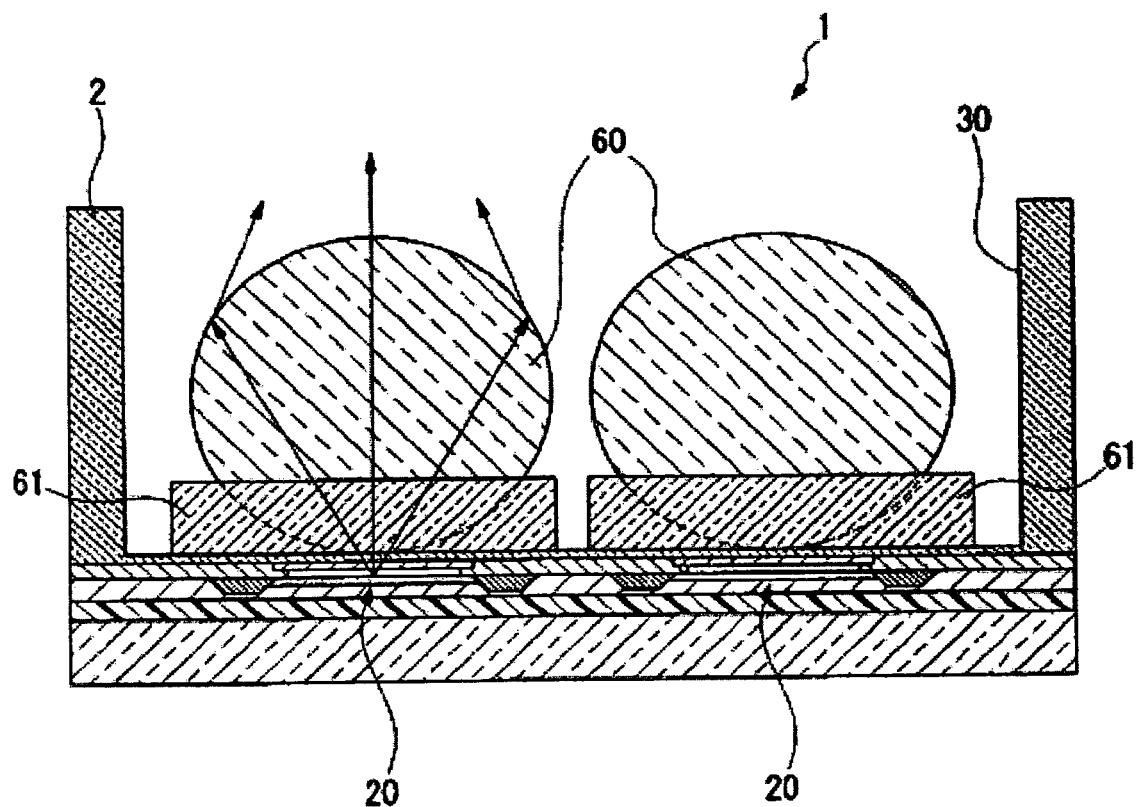
FIG. 8B is a side sectional view of the line head according to the sixth embodiment.

FIG. 8A is a plan view of the line head 1 according to the sixth embodiment, and FIG. 8B is a side sectional view taken along a line A-A in FIG. 8A.

The line head 1 of the present embodiment has the same structure as that of the line head 1 in the first embodiment except that a ball-like lens to be described later is provided.

Arrows in FIG. 8B indicate the exit directions of the light emitted from the light-emitting element 20.

As shown in FIGS. 8A and 8B, a ball-like lens 60 is disposed on the glass substrate 2 at a position immediately above each of the light-emitting elements 20 with adhesive 61.

As shown in FIG. 8B, the adhesive 61 is coated on each array of the lenses 60 for fixing the lenses 60 to the glass substrate 2.

Further, one adhesive 61 is formed with a gap from another adhesive 61 for fixing the adjacent lenses 60.

Each of the lenses 60 is made of a glass ball or the like, and is disposed immediately above each of the light-emitting elements 20 in alignment therewith so that the light emitted from the light-emitting element 20 can be focused.

Also, the ball-like lens 60 has a smaller aperture than that of the spherical lens 50 as earlier described in conjunction with the fifth embodiment, by which a higher condensing degree can be obtained.

Here, three interlayers between the lens 60, the adhesive 61, and glass substrate 2 have the same refractive index.

Next, in the line head 1 of the present embodiment, a case in which light is emitted from the light-emitting element 20 will be described.

The light emitted from the light-emitting element 20, as indicated by arrows in FIG. 8B, passes through the glass substrate 2 and then enters the lens 60 through the adhesive 61. At this time, as described above, the light is transmitted without being totally reflected at the interfaces between the glass substrate 2, the adhesive 61, and the lens 60 because the refractive indexes in interlayers between the glass substrate, the adhesive, and the lens are all the same.

Also, the light emitted from the light-emitting element 20 is refracted at the interface between the lens 60 and air to be focused as indicated by arrows in FIG. 8B.

Even when the light emitted from the light-emitting element 20 is transmitted through the adhesive 61 immediately above the light-emitting element, the light is refracted or reflected at an interface with an air layer existing in a gap of the adjacent row of adhesives 61.

Thus, the light emitted from the light-emitting element 20 does not enter the adhesive 61 formed on the adjacent row.

According to the line head 1 of the present embodiment, in addition to the effects that can be obtained from the structure common to that of the first embodiment that the recess is formed on the glass substrate, the ball-like lens 60 having a smaller curvature and a higher condensing degree is formed, so that the condensing degree of the light emitted from the light-emitting element 20 can be further increased. Thus, the exposure efficiency of the line head 1 can be improved.

In a case where the lens 60 has a high condensing degree and a light image is focused on a place away from the light-emitting element 20, for example, light can be focused on a desired position without using an focusing lens group. In addition, the curvature of the lens 60 may be adjusted so as to adjust the position of light to be focused.

Further, the adhesive 61 is provided in each array of the lenses 60 to prevent light from entering the adhesive 61 in the adjacent array of the adhesive 60, thereby preventing any crosstalk from occurring in the row direction of the light-emitting elements 20.

In addition, instead of the groove 30 of the present embodiment, the lens 60 may be formed after forming the groove 30 corresponding to each array of the light-emitting elements 20, as shown in FIG. 4A, forming the recess 40 in the whole arrays of the light-emitting elements 20 in a closed state, or as shown in FIG. 4B, forming the recess 40 in each array of the light-emitting elements 20 in a closed state, thereby enhancing the strength of the glass substrate 2 in the line head 1 to prevent a decrease in the strength of the line head 1 caused by the formation of the recess 40.

Next, a line head 1 according to a seventh embodiment of the invention will be described.

Figure 9A:
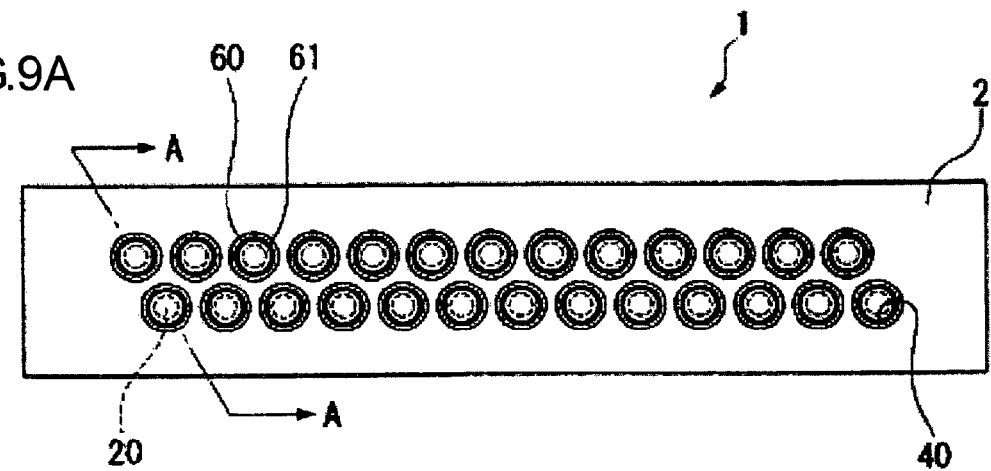
FIG. 9A illustrates a line head according to a seventh embodiment.
Figure 9B:
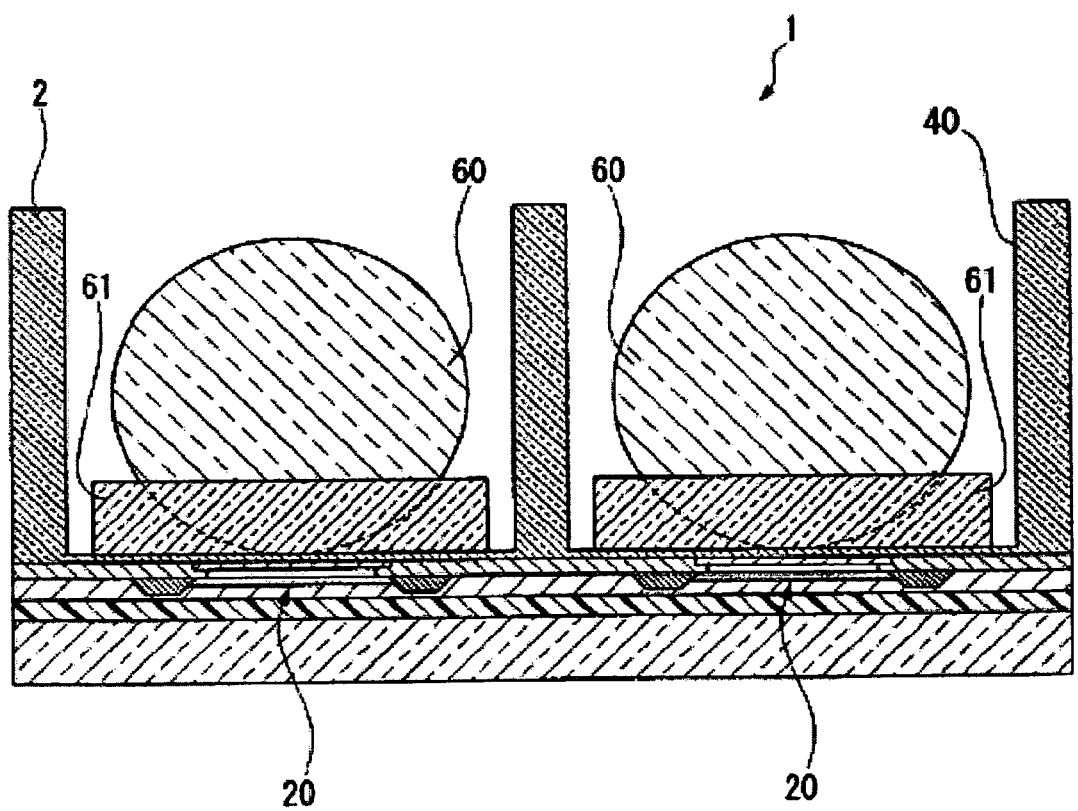
FIG. 9B is a side sectional view of the line head according to the seventh embodiment.

FIG. 9A is a plan view of the line head 1 according to the seventh embodiment, and the FIG. 9B is a side sectional view taken along a line A-A in FIG. 9A.

The line head 1 has the same structure as the structure of the line head 1 in the fourth embodiment except that a ball-like lens to be described later is formed.

In the line head 1 of the present embodiment, as shown in FIGS. 9A and 9B, a recess 40 is formed on the glass substrate 2 immediately above each of the light-emitting elements 20, and a lens 60 is provided on the glass substrate 2 immediately above each of the light-emitting elements 20. When the lens 60 is disposed, the alignment of the lens 60 can be facilitated by allowing the lens 60 to drop into the recess 40. Further, each lens 60 is fixed onto the glass substrate 2 with the adhesive 61. In this way, the lens 60 is provided within the recess 40.

At this time, the refractive indexes in interlayers between the lens 60, the adhesive 61, and the glass substrate 61 are all the same.

Next, a case in which light is emitted from the light-emitting element 20 in the line head 1 of the present embodiment will be described.

The light emitted from the light-emitting element 20 is transmitted through the adhesive 61 formed on each lens 60 and the lens 60 to be emitted to the outside. Further, since the adhesive 61 adheres to each lens 60, light is refracted or totally reflected at the interface between the adhesive 61 and air. Therefore, light does not enter the adjacent lens 60 through the adhesive 61.

According to the line head 1 of the present embodiment, in addition to the effects similar to those of the sixth embodiment, the adhesive 61 is provided in each lens 60, so that light can be prevented from entering the adjacent adhesive 61 through the adhesive 61, thereby improving the exposure precision of the line head 1.

In addition, instead of the recess 40 of the present embodiment, each ball-like lens 60 may be fixed with the adhesive 61 after forming the groove 30 corresponding to each row of the light-emitting elements 20, or forming the recess 40 in each row of the light-emitting elements 20 in a closed state on the glass substrate 2.

Next, a line head 1 according to an eighth embodiment of the invention will be described.

The line head 1 of the present embodiment has the same basic structure as that of the line head 1 in the first embodiment.

The line head 1 of the present embodiment can be applied to a case in which a recess is formed on the element substrate 10 which faces the glass substrate 2.

Figure 10:
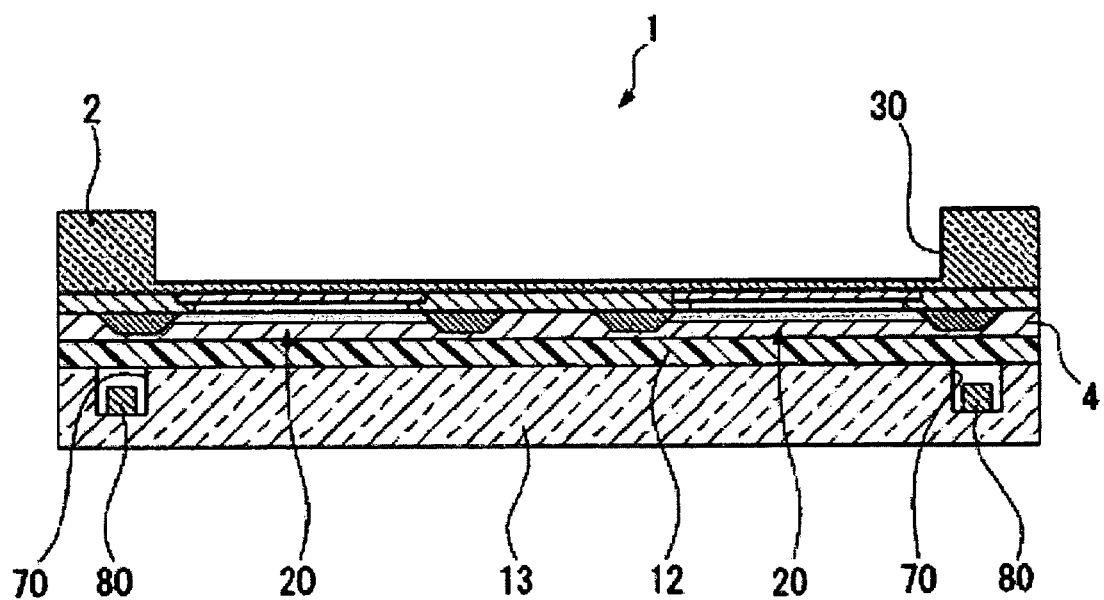
FIG. 10 is a side sectional view of a line head according to an eighth embodiment.

As shown in FIG. 10, a recess (a second recess) 70 is formed on the inner surface of the sealing substrate 13 (on an interface with the sealing substrate 13). The recess 70 is formed on a portion of the sealing substrate 13 rather than on the portion immediately above the groove 30 formed on the glass substrate 2. Here, the recess 70 is provided with a drying agent 80.

Thus, since the groove 30 formed on the glass substrate 2 does not overlap the recess 70 formed on the sealing substrate 13, the glass substrate 2 in the region where the groove 30 is formed can be prevented from becoming thin.

According to the line head 1 of the present embodiment, in addition to the effects similar to those of the first embodiment, the drying agent 80 is provided on the side of the negative electrode 4, so that the negative electrode 4 or the like can be prevented from deteriorating due to moisture or the like in the air.

Further, the groove 70 is formed on the sealing substrate 13 at a position other than the portion immediately above the groove 30 of the glass substrate 2, so that a decrease in strength of the portion of the glass substrate 2 where the groove 30 is formed can be prevented, and thus a decrease in strength of the line head 1 can be suppressed to the minimum.

In addition, the groove 30 may be provided with the spherical lens 50, the ball-like lens 60, or the like, so that the exposure efficiency of the line head 1 can be improved.

Further, instead of the groove 30 of the present embodiment, the groove 30 may be provided on the glass substrate 2 corresponding to each row of the light-emitting elements 20, or the recess 40 is formed on the glass substrate in each row of the light-emitting elements 20 in a closed state, so that the strength of the glass substrate 2 in the line head 1 can be increased, thereby preventing a decrease in strength of the line head 1 caused by the formation of the recess 40.

In addition, the invention is not limited to the above embodiments, and various changes or modifications can be made without departing from the spirit and scope of the invention.

For example, although the above embodiments have been described with respect to the bottom-emission-type line head in which light is emitted to the glass substrate 2, the invention may be applied to a top-emission-type line head in which light is emitted to the sealing substrate 13. In this case, similar to the bottom-emission-type line head, the groove 30 or the recess 40 can be formed on the sealing substrate 13, thereby improving the exposure efficiency of the line head 1. Further, although the above embodiments have been described with respect to the line head including EL elements as the light-emitting elements 20, a line head including LEDs as the light-emitting elements may be used.

Further, although two rows of light-emitting elements 20 are formed, the invention is not limited thereto. For example, two or more rows of light-emitting elements 20 or one row of light-emitting elements 20 may be formed.

Figure 11:
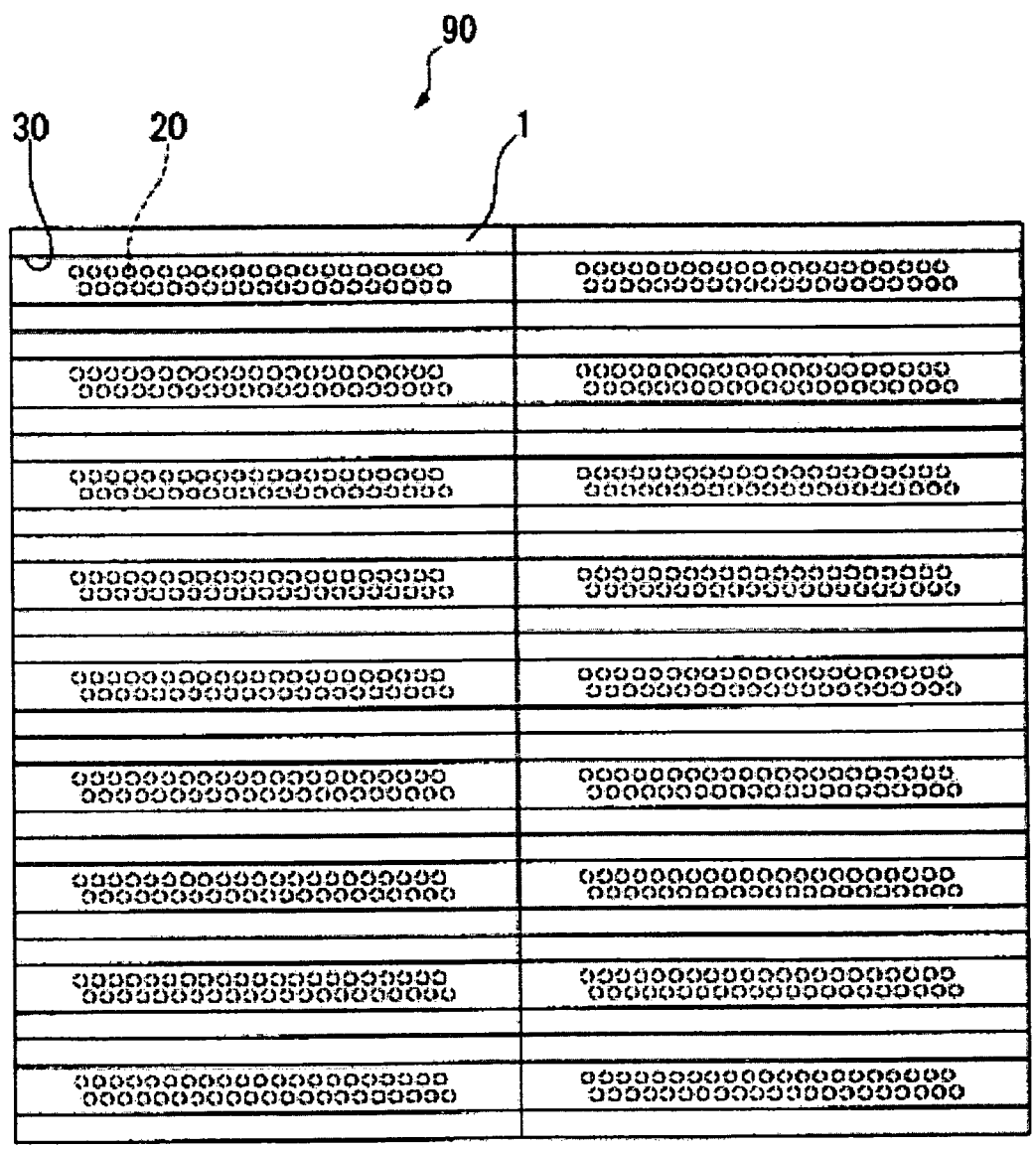
FIG. 11 is a plan view showing a state of a large line head.

Further, when a groove 30, a recess 40, or the like is formed, the groove 30, the recess 40, or the like is formed after a large substrate is divided into separate line heads 1. However, as shown in FIG. 11, line heads 1 may be formed on a large substrate 90, and then the groove 30, the recess 40, or the like may be formed on the large substrate 90, or the groove 30 or the recess 40 may be formed for a predetermined number of line heads 1, thereby improving the productivity.

Next, an image forming apparatus 100 including the line head 1 of the invention will be described.

Figure 12:
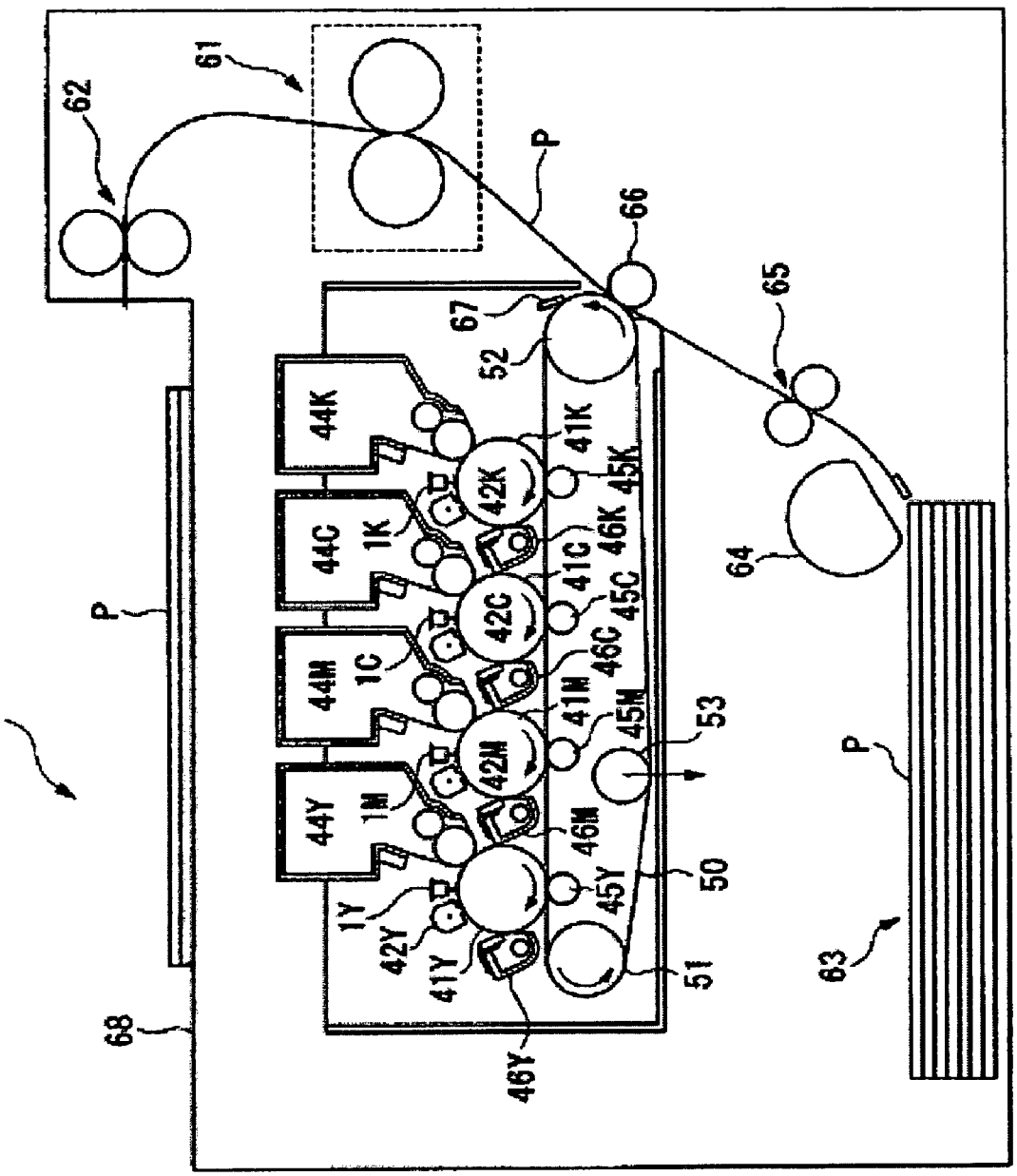
FIG. 12 is a schematic view showing a first example of an image forming apparatus according to the invention.

FIG. 12, is a longitudinal sectional view showing a first example of the image forming apparatus 100 including the line head 1 of the invention.

The image forming apparatus 100 is constituted as a tandem type image forming apparatus 100 in which four line heads 1K, 1C, 1M, and 1Y are arranged at exposure positions of corresponding four photosensitive drums (image carriers) 41K, 41C, 41M, and 41Y with the same configuration.

As shown in FIG. 12, the image forming apparatus includes a driving roller 51, a follower roller 52, a tensioning roller 53, and an intermediate transfer roller 50 which is stretched over the driving roller 51 and the follower roller 52 with tension applied by the tensioning roller 53 and which is driven to be circulated in the direction (in the counterclockwise direction) indicated by an arrow in FIG. 12. The photosensitive bodies 41K, 41C, 41M, and 41Y each having a photosensitive layer on its outer circumferential surface are arranged as four image carriers which are arranged with a predetermined gap with respect to the intermediate transfer belt 50.

The characters K, C, M, and Y added to the reference numerals indicate black, cyan, magenta, and yellow, respectively. Thus, the photosensitive bodies are for black, cyan, magenta, and yellow. This is also applied to the other kinds of members. The photosensitive bodies 41K, 41C, 41M, and 41Y are driven and rotated in the direction (clockwise direction) indicated by an arrow in FIG. 12, in synchronization with the driving of the intermediate transfer belt 50.

A charging unit (a corona charger) 42 (K, C, M, or Y) for uniformly charging the outer circumferential surface of the photosensitive body 41 (K, C, M, or Y); and a line head 1 (K, C, M, or Y) for sequentially scanning the outer circumferential surface uniformly charged by the charging unit 42 (K, C, M, or Y), in synchronization with the rotation of the photosensitive body 41 (K, C, M, or Y) are arranged around each photosensitive body 41 (K, C, M, or Y).

The image forming apparatus is provided with a developing unit 44 (K, C, M, or Y) for imparting toner, serving as a developer, onto an electrostatic latent image formed by the line head 1 (K, C, M, or Y) and thereby for converting the image into a visible image (toner image); a primary transfer roller 45 (K, C, M, or Y) as a primary transfer unit for sequentially transferring the toner image developed by the developing unit 44 (K, C, M, or Y) onto the intermediate transfer belt 50, serving as a primary transfer target; and a cleaning unit 46 (K, C, M, or Y) for removing toner remaining on the surface of the photosensitive body 41 (K, C, M, or Y) after the transfer.

It should be noted that each line head 1 (K, C, M, or Y) is arranged such that the arrayed direction of the line heads is aligned with the generatrix of each photosensitive body 41 (K, C, M, or Y). Further, the light emission energy peak wavelength of each line head 1 (K, C, M, or Y) is set to coincide approximately with the sensitivity peak wavelength of each line head 41 (K, C, M, or Y).

In the developing unit 44(K, C, M, or Y), for example, a non-magnetic single-component toner is used as the developer. The single-component developer is conveyed to a developing roller by, for example, a supplying roller. The film thickness of the developer adhered to the surface of the developing roller is regulated by a control blade. Then, the developing roller is brought into contact with or pressed against the photosensitive body 41 (K, C, M, or Y), so as to cause the developer to be adhered thereto depending on the potential level on the photosensitive body 41 (K, C, M, or Y), so that development into a toner image is performed.

The four toner images of black, cyan, magenta, and yellow generated by such four single-color toner image forming stations are primarily transferred sequentially onto the intermediate transfer belt 50 owing to a primary transfer bias applied on each primary transfer roller 45 (K, C, M or Y). A full-color toner image generated by overlaying these single-color toner images on the intermediate transfer belt 50 is secondarily transferred onto a recording medium P, such as a paper sheet, by a secondary transfer roller 66. The image is fixed on the recording medium P during the passage through a pair of fixing rollers 61, serving as a fixing unit. The recording medium P is then ejected through a pair of sheet ejection rollers 62 onto a sheet ejection tray 68 provided on the top of the apparatus.

In addition, reference numeral 63 designates a sheet feed cassette for holding a stack of a large number of recording media P. Reference numeral 64 designates a pick-up roller for feeding the recording medium P one by one from the sheet feed cassette 63. Reference numeral 65 designates a pair of gate rollers for defining the timing of feeding the recording medium P to a secondary transfer section of the secondary transfer roller 66. Reference numeral 67 designates a cleaning blade for removing the toner remaining on the surface of the intermediate transfer belt 50 after the secondary transfer.

Since the image forming apparatus of the invention includes the above-mentioned line head 1 as a writing unit, the light emitted from the light-emitting element 20 can be efficiently output, and thus the exposure efficiency of the line head as a light source can be improved. Further, since the line head 1 prevents crosstalk of the light emitted from the light-emitting element 20, the exposure precision of the image forming apparatus 100 including the line head can be improved.

Next, a second example of an image forming apparatus 200 according to the invention will be described.

Figure 13:
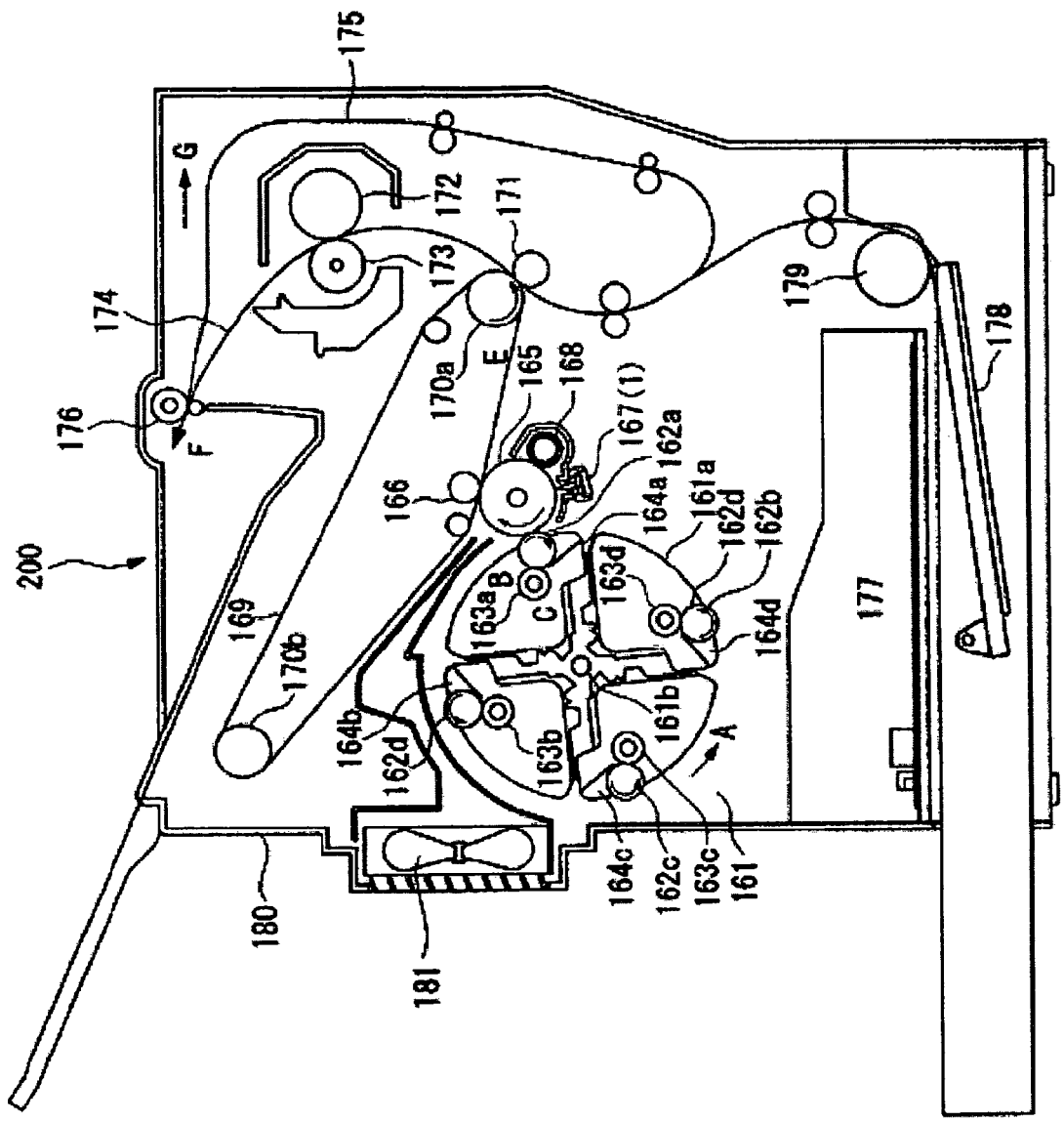
FIG. 13 is a schematic view showing a second example of an image forming apparatus according to of the invention.

As shown in FIG. 13, this image forming apparatus 200 includes: a developing unit 161 having rotary arrangement; a photosensitive drum 165 functioning as an image carrier; an image writing unit 167 provided with the line head 1 of the invention; an intermediate transfer belt 169; a sheet conveying path 174; a heating roller 172 of a fixing device; and a sheet feeding tray 178.

In the present example, the image forming apparatus is constituted as a four-cycle-type image forming apparatus 200.

In the developing unit 161, a developing rotary 161a turns in the direction indicated by an arrow A around a shaft 161b. The inside of the developing rotary 161a is divided into four sections each provided with one of the image forming units for four colors of yellow (Y), cyan (C), magenta (M), and black (K). Reference numerals 162a to 162d indicate developing rollers each arranged in each of the image forming units for four colors and rotating in the direction indicated by an arrow B. Reference numerals 163a to 163d indicate toner supply rollers rotating in the direction indicated by an arrow C. Reference numerals 164a to 164d indicate control blades for regulating the toner thickness to a predetermined value.

The photosensitive drum 165 is provided with a primary transfer member 166, a charger 168, and a line head 1 used as an image writing unit 167. Further, the photosensitive drum 165 is driven by a driving motor (not shown), such as a stepping motor, in a direction indicated by an arrow D, which is reverse to the rotating direction of the developing roller 162a.

The intermediate transfer belt 169 is stretched over a driving roller 170a and a follower roller 170b. The driving roller 170a is linked to a driving motor of the photosensitive drum 165 so as to transmit power to the intermediate transfer belt 169. When this driving motor operates, the driving roller 170a of the intermediate transfer belt 169 rotates in the direction indicated by an arrow E, which is reverse to the rotating direction of the photosensitive drum 165.

The sheet conveying path 174 is provided with a plurality of conveying rollers and a pair of sheet ejection rollers 176 so as to convey a paper sheet. An image (toner image) on one side carried by the intermediate transfer belt 169 is transferred to one side of the paper sheet at the position of the secondary transfer roller 171. The secondary transfer roller 171 is brought into contact with or separated from the intermediate transfer belt 169 by a clutch mechanism. When the clutch operates, the secondary transfer roller 171 is brought into contact with or separated from the intermediate transfer belt 169, so that the image is transferred to the paper sheet.

Next, the paper sheet carrying the image transferred as described above undergoes a fixing process in the fixing device having a fixing heater H. The fixing device is provided with a heating roller 172 and a pressure roller 173. The paper sheet after the fixing process is drawn into the pair of sheet ejection rollers 176 to travel in the direction indicated by an arrow F. In this state, when the pair of sheet ejection rollers 176 turns reversely, the paper sheet travels reversely in the direction indicated by an arrow G through a sheet conveying path 175 for double-side printing. Reference numeral 177 designates an electric equipment box. Reference numeral 178 designates a sheet feeding tray for housing paper sheets. Reference numeral 179 designates a pick-up roller provided at the exit of the sheet feeding tray 178.

The driving motor used for driving the conveying rollers in the sheet conveying path is, for example, a low-speed brushless motor. A stepping motor is used for the intermediate transfer belt 169 because of the necessity of color shift correction. These motors are controlled by signals provided from a controller which is not shown.

In the state shown in FIG. 13, an electrostatic latent image of yellow (Y) is formed on the photosensitive drum 165, and a high voltage is applied to the developing roller 162a. As a result, an image of yellow is formed on the photosensitive drum 165. When both the backside image and the front side image of yellow are carried by the intermediate transfer belt 169, the developing rotary 161a turns by 90 degrees in the direction indicated by the arrow A.

The intermediate transfer belt 169 makes one turn, and returns to the position of the photosensitive drum 165. Next, the two sides of images of cyan (C) are formed on the photosensitive drum 165. These images are then overlaid on the image of yellow carried on the intermediate transfer belt 169. Thereafter, similar processes are repeated. That is, the developing rotary 161 turns by 90 degrees. Then, the intermediate transfer belt 169 makes one turn after the transfer of the images.

In order that all the images of four colors are transferred to the intermediate transfer belt 169, the intermediate transfer belt 169 needs to makes four turns. Thereafter, the turning position is controlled so that the images are transferred to a paper sheet at the position of the secondary transfer roller 171. A paper sheet fed from the sheet feeding tray 178 is conveyed along the conveying path 174, and then one of the color images is transferred to one side of the paper sheet at the position of the secondary transfer roller 171. The paper sheet one side of which carries the transferred image is reversed by the pair of sheet ejection rollers 176 as described above, and then waits in the conveying path. Thereafter, at an appropriate timing, the paper sheet is conveyed to the position of the secondary transfer roller 171, so that the other color image is transferred to the other side. A housing 180 is provided with an exhaust fan 181.

Since the image forming apparatus 200 of the invention includes the above-mentioned line head 1 as a writing unit, the light exited from the light-emitting element 20 can be efficiently output, and thus the exposure efficiency of the line head as a light source can be improved. Further, since any crosstalk of the light exited from the light-emitting element 20 can be prevented, the exposure efficiency of the image forming apparatus 100 including the line head can be improved.

Although the image forming apparatuses including the line head 1 of the invention has been described with respect to the embodiments, the invention is not limited to these, and various modifications can be made.

What is claimed is:

1. A device comprising:
    an element substrate having a glass substrate and light-emitting elements arrayed above a first side of the glass substrate;
    a sealing substrate that seals the light-emitting elements above the glass substrate, and
    an adhesive resin that joins the sealing substrate to the element substrate, the adhesive resin being disposed between the sealing substrate and the light-emitting elements,
    wherein a recess is formed on a portion of a second side of the glass substrate that is opposite to the first side of the glass substrate arrayed with the light emitting elements, light emitted from the light-emitting elements emits from the second side of the glass substrate, and the recess is formed to include an entire region immediately above at least the light-emitting elements.

2. The device according to claim 1,
    wherein a bottom surface of the recess has an uneven surface.

3. The device according to claim 1,
    wherein a corner of a bottom of the recess is formed in a curved shape which is concaved toward an inside of the recess.

4. The device according to claim 1,
    wherein a lateral wall surface of the recess is formed in a tapered shape that becomes gradually closer to an inside as the lateral wall surface approaches a bottom side.

5. The device according to claim 1,
    wherein the recess is formed so as to span across the second side of the glass substrate from one edge to an opposite edge.

6. The device according to claim 5,
    wherein the recess is formed to correspond to the array of light-emitting elements.

7. The device according to claim 1,
the second side of the glass substrate having a first region where the recess is formed and having a second region where the recess is not formed, the first region being surrounded by the second region.

8. The device according to claim 1,
wherein the bottom of the recess is provided with a spherical lens.

9. The device according to claim 1,
wherein a bottom of the recess is provided with a ball lens.

10. The device according to claim 9,
wherein the ball lens is fixed to the bottom of the recess with an adhesive.

11. The device according to claim 10,
wherein, in a case where a plurality of rows of light-emitting elements are formed, and a plurality of the ball lenses corresponding to the plurality of rows of light-emitting elements are arrayed in the recess, the adhesive is coated on each of the rows of ball lenses.

12. The device according to claim 10,
wherein the adhesive is coated on each of the ball lenses.

13. The device according to claim 1,
wherein, in a case where the light-emitting elements are formed above the element substrate, a second recess is formed above the sealing substrate at a place other than the portion immediately above the light-emitting elements, and the second recess is provided with a drying agent.

14. An image forming apparatus comprising the device according to claim 1.

15. The device according to claim 1,
the recess spanning continuously across at least two of the light-emitting elements.

16. The device according to claim 1,
the element substrate having at least one partition wall disposed between the glass substrate and the sealing substrate.

17. The device according to claim 1,
the recess being formed by at least one of polishing, sand blasting, dry etching and wet etching.

18. A device comprising:
an element substrate having a glass substrate and light-emitting elements arrayed above a first side of the glass substrate:
a sealing substrate that seals the light-emitting elements above the glass substrate, and
an adhesive resin that joins the sealing substrate to the element substrate, the adhesive resin being disposed between the sealing substrate and the light-emitting elements,
wherein a recess is formed on a portion of a second side of the glass substrate that is opposite to the first side of the glass substrate arrayed with the light emitting elements, light emitted from the light-emitting elements emits from the second side of the glass substrate, the second side of the glass substrate having a first region where the recess is formed and having a second region where the recess is not formed, the first region being surrounded by the second region, and the recess is formed to correspond to each of the light-emitting elements.

19. A device comprising:
an element substrate having a glass substrate and light-emitting elements arrayed above first side of the glass substrate; and
a sealing substrate that seals the light-emitting elements above the glass substrate,
wherein a recess is formed on a portion of a second side of the glass substrate that is opposite to the first side arrayed with the light emitting elements, light emitted from the light-emitting elements emitting from the second side of the glass substrate, and the recess spanning continuously across at least two of the light-emitting elements.

20. The device according to claim 19,
the element substrate having at least one partition wall disposed between the glass substrate and the sealing substrate.

* * * * *